United States Patent
Takita et al.

(10) Patent No.: US 9,497,874 B2
(45) Date of Patent: Nov. 15, 2016

(54) ELECTRONIC DEVICE

(71) Applicant: FUJITSU LIMITED, Kawasaki-shi, Kanagawa (JP)

(72) Inventors: Hiroyuki Takita, Sapporo (JP); Yoshifumi Kajiwara, Sapporo (JP); Masahiro Fukuhara, Sapporo (JP); Hiroshi Kubo, Sapporo (JP)

(73) Assignee: FUJITSU LIMITED, Kawasaki (JP)

( * ) Notice: Subject to any disclaimer, the term of this patent is extended or adjusted under 35 U.S.C. 154(b) by 147 days.

(21) Appl. No.: 14/053,337

(22) Filed: Oct. 14, 2013

(65) Prior Publication Data

US 2014/0111920 A1 Apr. 24, 2014

(30) Foreign Application Priority Data

Oct. 22, 2012 (JP) .................................. 2012-233243

(51) Int. Cl.
*H01H 13/06* (2006.01)
*H05K 5/06* (2006.01)
*H01H 13/86* (2006.01)

(52) U.S. Cl.
CPC .............. *H05K 5/069* (2013.01); *H01H 13/06* (2013.01); *H01H 13/063* (2013.01); *H01H 13/86* (2013.01); *H01H 2223/002* (2013.01)

(58) Field of Classification Search
CPC .... H01H 13/06; H01H 13/063; H01H 13/86; H01H 2223/002; H05K 5/069
USPC ........................................... 200/302.1–302.3
See application file for complete search history.

(56) References Cited

U.S. PATENT DOCUMENTS

| 7,795,553 B2 | 9/2010 | Weber et al. |
| 8,237,072 B2 * | 8/2012 | Kubota ...................... 200/302.2 |
| 8,933,354 B2 * | 1/2015 | Ohata et al. .................. 200/293 |
| 2010/0243422 A1 | 9/2010 | Arihara et al. |
| 2012/0227251 A1 | 9/2012 | Hyuga et al. |
| 2012/0325637 A1 | 12/2012 | Kikuchi |
| 2013/0001055 A1 | 1/2013 | Ohata et al. |

FOREIGN PATENT DOCUMENTS

| JP | 2004-273208 A | 9/2004 |
| JP | 2010-108749 A | 5/2010 |
| JP | 2011-204461 A | 10/2011 |
| WO | 2012/011236 A1 | 1/2012 |

OTHER PUBLICATIONS

Bonnie Cha, Motorola Atrix 4G Review, Feb. 9, 2011, C/Net.com, p. 5, lines 1-4.*
Extended European Search Report dated Feb. 19, 2014, issued in European Patent Application No. 13188964.4 (2 pages).
Non-Final Office Action dated Apr. 22, 2016, issued in U.S. Appl. No. 15/000,451 (9 pages).

* cited by examiner

*Primary Examiner* — Renee S Luebke
*Assistant Examiner* — Lheiren Mae A Caroc
(74) *Attorney, Agent, or Firm* — Westerman, Hattori, Daniels & Adrian, LLP

(57) ABSTRACT

An electronic device includes: an enclosure that has an opening formed therein; a switch disposed in the enclosure opposite the opening; a key top member disposed inside the opening; and a water sealing member that has a wall part which extends such that a height direction of the wall part coincides with an opening direction of the opening and which seals an inner surface of the opening, an arm part which extends from the wall part to the inner side of the opening and supports the key top member, and a wall part reinforcer provided in the wall part.

10 Claims, 4 Drawing Sheets

ELECTRONIC DEVICE

CROSS-REFERENCE TO RELATED APPLICATION

This application is based upon and claims the benefit of priority of the prior Japanese Patent Application No. 2012-233243, filed on Oct. 22, 2012, the entire contents of which are incorporated herein by reference.

FIELD

The embodiment discussed herein is related to an electronic device.

BACKGROUND

Electronic devices that include an enclosure with an opening formed therein, a switch provided in the enclosure opposite the opening, a key top member disposed inside the opening, and a water sealing member for both supporting the key top member and keeping water from entering through the opening are known.

Some electronic devices of this type block entry of water from the opening by forming a slit around the opening and press-fitting a part of the water sealing member into the slit.

Related arts are disclosed in Japanese Laid-open Patent Publication Nos. 2010-108749 and 2011-204461, for example.

SUMMARY

According to an aspect of the invention, an electronic device includes: an enclosure that has an opening formed therein; a switch disposed in the enclosure opposite the opening; a key top member disposed inside the opening; and a water sealing member that has a wall part which extends such that a height direction of the wall part coincides with an opening direction of the opening and which seals an inner surface of the opening, an arm part which extends from the wall part to the inner side of the opening and supports the key top member, and a wall part reinforcer provided in the wall part.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An embodiment of the technique according to the present disclosure will be described.

Figure 1:
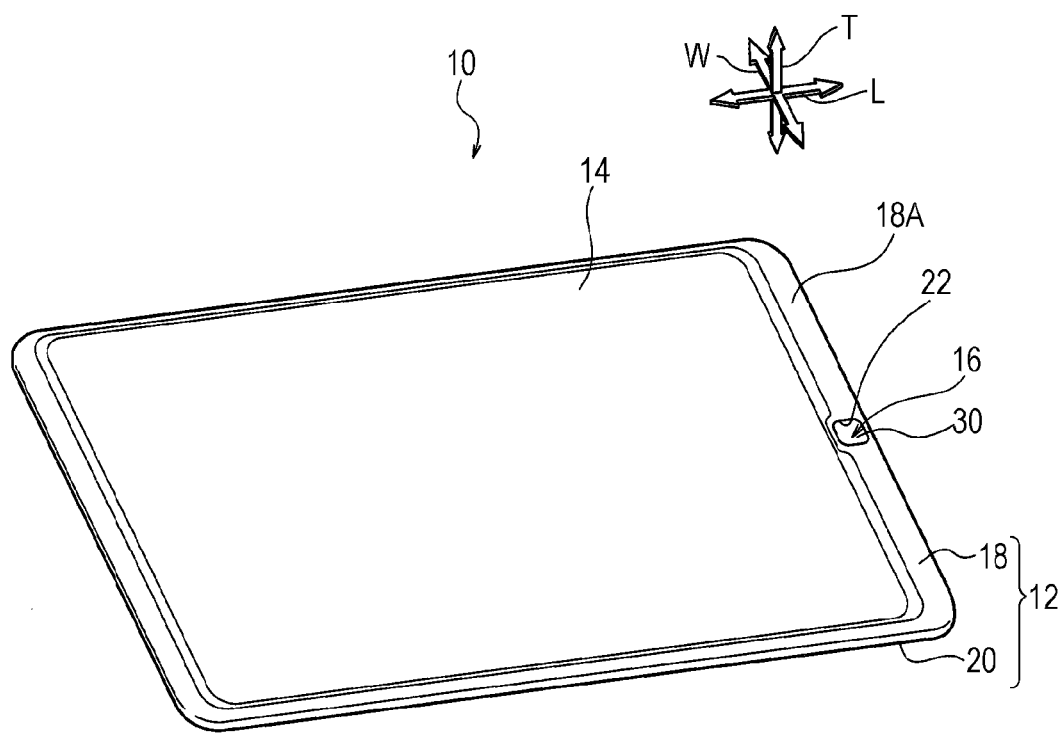
FIG. 1 is a perspective view of an electronic device.

As depicted in FIG. 1, an electronic device 10 according to the embodiment includes an enclosure 12, a display 14, and a sensor unit 16. Arrows T, L, and W in the drawings represent the thickness, length, and width directions of the electronic device 10 (the enclosure 12), respectively.

The enclosure 12 has a front case 18 and a rear case 20. The front case 18 and rear case 20 are separated from each other in the thickness direction of the enclosure 12. The front case 18 is formed in a frame shape, and the display 14, which may be a liquid crystal display for example, is mounted inside the front case 18.

The front case 18 and rear case 20 contain an internal unit including a control board and a battery, for example, and the display 14 is driven by the control board of the internal unit.

Figure 3:
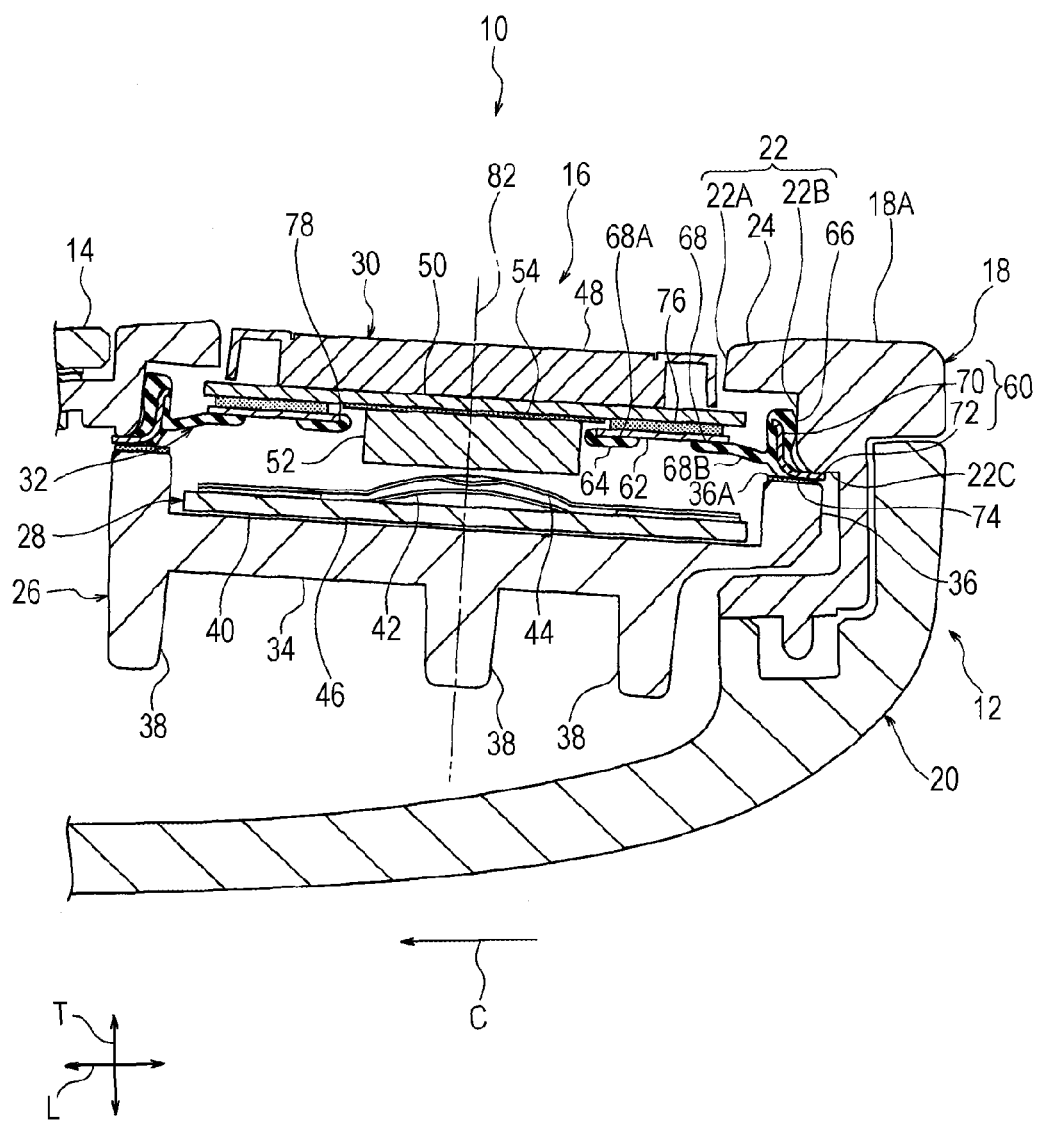
FIG. 3 is a longitudinal sectional view of the sensor unit and surrounding components depicted in FIG. 1.

As illustrated in FIG. 3, on one edge 18A (an upper edge) of the front case 18 when seen in the length direction, an opening 22 is formed through the edge 18A in its thickness direction. At an upper portion 22A of the opening 22 on the upper surface side of the enclosure 12, a flange 24 protruding to the inside of the opening 22 is formed. The flange 24 is formed around the entire circumference of the opening 22. Due to the presence of the flange 24, the upper portion 22A of the opening 22 on the front surface side of the enclosure 12 has a smaller opening area than a lower portion 22B of the opening 22, which is on the back surface side of the enclosure 12.

The sensor unit 16 is disposed at a position corresponding to the opening 22 described above. The sensor unit 16 has a holder member 26, a switch 28, a fingerprint sensor module 30, and a water sealing member 32 (see also FIG. 2).

Figure 2:
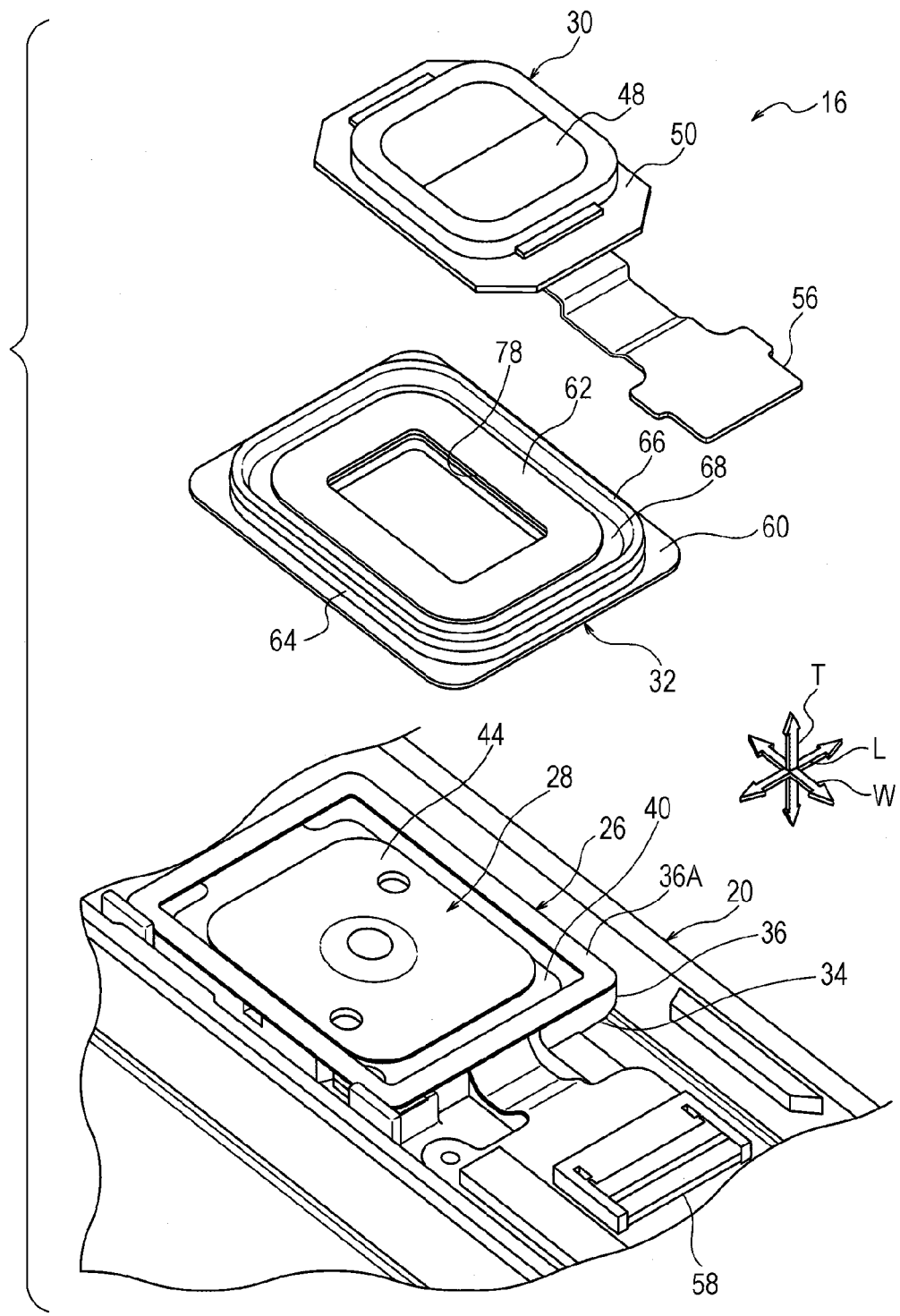
FIG. 2 is an exploded perspective view of the sensor unit and the rear case depicted in FIG. 1.

The holder member 26 is fixed inside the rear case 20 as depicted in FIG. 2. The holder member 26 has a supporting part 34 and an extending part 36. The supporting part 34 is formed in a planar shape and is positioned opposite the above-described opening 22 as illustrated in FIG. 3. The extending part 36 is circularly formed along the circumference of the supporting part 34 and extends from the circumference of the supporting part 34 to the opening 22 side (that is, the upper surface side of the enclosure 12). The supporting part 34 has multiple ribs 38 formed thereon. The ribs 38 all extend in the opposite direction to the extending part 36 (that is, to the back surface side of the enclosure 12).

The switch 28, which is a so-called dome switch, has a substrate 40, a fixed contact 42, and a movable contact 44. The switch 28 is disposed in the enclosure 12 opposite the opening 22. The substrate 40 is fixed to the supporting part 34 of the holder member 26 with double-sided adhesive tape 46, and the fixed contact 42 and movable contact 44 are fixed to the surface of the substrate 40 on the opening 22 side. The movable contact 44 has a bulge on the upper surface side of the enclosure 12, and is positioned on the upper surface side of the enclosure 12 with respect to the fixed contact 42. The movable contact 44 is elastic; when it is pressed to the back surface side of the enclosure 12, it comes into contact with the fixed contact 42.

The fingerprint sensor module 30, which is an example of a key top member, is disposed inside the opening 22. The fingerprint sensor module 30 has a sensor portion 48, a substrate 50, and a spacer 52. The sensor portion 48 has multiple electrodes arranged in a matrix in the direction orthogonal to the opening direction of the opening 22 (that is, to the axis direction of a central axis line 82). The sensor portion 48 is mounted on a surface of the substrate 50. The sensor unit 48 outputs a signal representing the positions of valleys and ridges of a fingerprint when a user touches the sensor portion 48 with a finger.

The substrate 50 of the sensor module 30 is positioned in parallel with the substrate 40 of the switch 28 described above. On the underside of the substrate 50, the spacer 52 is fixed with double-sided adhesive tape 54 at a position opposite to the movable contact 44 described above. To the substrate 50, a film-like wiring member 56 is connected as illustrated in FIG. 2. The wiring member 56 is connected with a connector 58 provided in the rear case 20 through the inside of the circular water sealing member 32 discussed later.

The water sealing member 32 has a wall part reinforcer 60, an arm part reinforcer 62, and a rubber part 64. The wall part reinforcer 60 and the arm part reinforcer 62 are both made of sheet metal. The rubber part 64 is molded as one piece with the wall part reinforcer 60 and the arm part reinforcer 62 and has a wall part 66 and an arm part 68. The wall part 66 extends such that its height direction coincides with the opening direction of the opening 22, and tightly fits on the inner surface of the opening 22, as depicted in FIG. 3. The wall part 66 is circularly formed around the fingerprint sensor module 30.

The arm part 68 is positioned between the fingerprint sensor module 30 and the switch 28 when seen in the opening direction of the opening 22. The arm part 68 extends at an angle from a middle portion of the wall part 66 in its height direction, to the inner side of the opening 22 and to the side of the fingerprint sensor module 30. As an example of the middle portion of the wall part 66 in its height direction, the arm part 68 is connected to a part on the lower end side of the center of the wall part 66 in its height direction. An end 68A of the arm part 68 supports the fingerprint sensor module 30 from the switch 28 side (the back surface side of the enclosure 12). The arm part 68 is formed around the entire circumference of the wall part 66.

The wall part reinforcer 60 reinforces the wall part 66, and includes a reinforcer body 70 which extends such that its height direction coincides with the height direction of the wall part 66, and a bent portion 72 formed by bending the reinforcer body 70 at a lower end thereof toward the outer side of the opening 22. The reinforcer body 70 and the bent portion 72 are circularly formed in the circumferential direction of the opening 22. The reinforcer body 70 is buried in the wall part 66, and the bent portion 72 is exposed (or protrudes) from the lower end of the wall part 66. The lower end of the wall part 66 formed on the rubber part 64 and the bent portion 72 are fixed to an end 36A of the extending part 36 with double-sided adhesive tape 74. The bent portion 72 is secured between an opening edge 22C of the opening 22 on the side of the extending part 36 (the back surface side of the enclosure 12) and the end 36A of the extending part 36 together with the double-sided adhesive tape 74.

The arm part reinforcer 62 is a separate piece from the wall part reinforcer 60. The arm part reinforcer 62 is formed in a planer shape and disposed such that its thickness direction coincides with the opening direction of the opening 22. By being integral with the end 68A of the arm part 68, the arm part reinforcer 62 reinforces the end 68A of the arm part 68. The arm part reinforcer 62 is fixed to the underside of the substrate 50 of the fingerprint sensor module 30 with double-sided adhesive tape 76. A hole 78 is formed in a center of the arm part reinforcer 62; the water sealing member 32 is circularly formed as a whole (see also FIG. 2).

A connecting portion 68B of the arm part 68 formed between the wall part 66 and the end 68A of the arm part 68 is formed of the rubber of the rubber part 64. As a result, the above-described fingerprint sensor module 30 is resiliently supported relative to the front case 18 and also is able to move in the opening direction of the opening 22. When the fingerprint sensor module 30 is pressed by a finger, the spacer 52 pushes down the movable contact 44, which comes into contact with the fixed contact 42.

Figure 4:
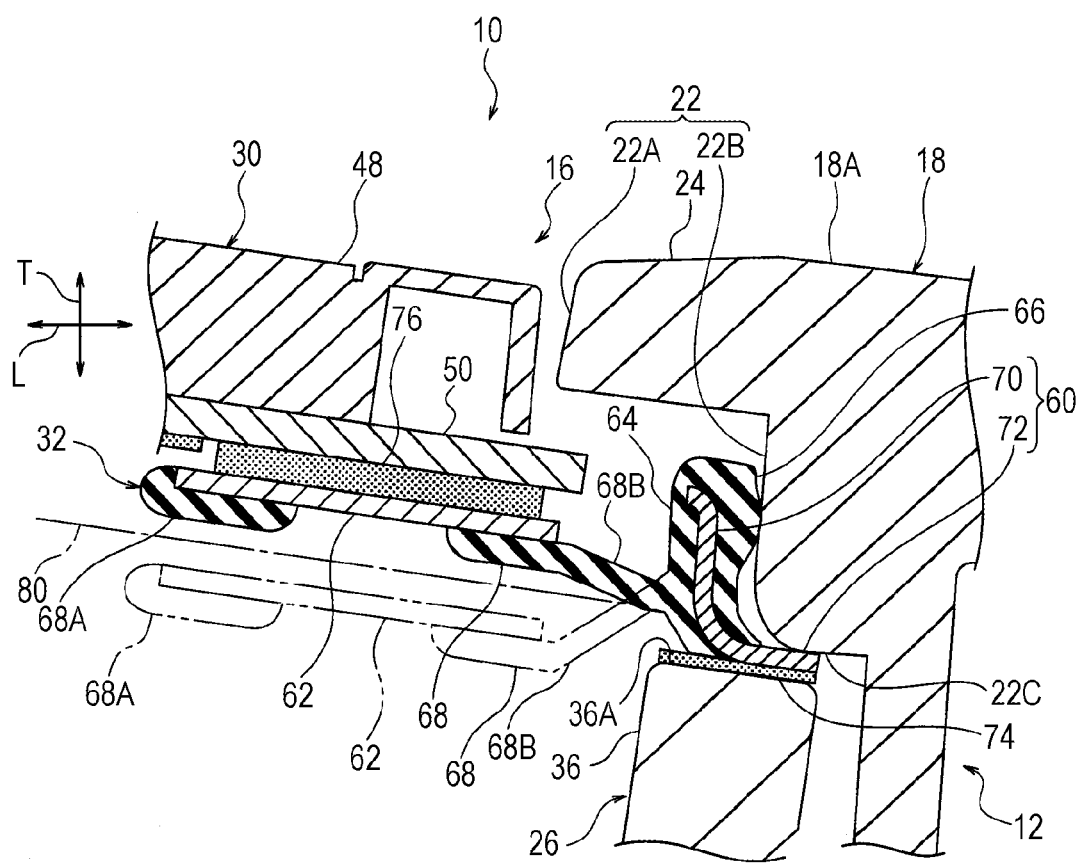
FIG. 4 is an enlarged view of components of FIG. 3.

When assuming that a line orthogonal to the opening direction of the opening 22 and passing through the connecting portion between the arm part 68 and the wall part 66 is a virtual center line 80 as illustrated in FIG. 4, the fingerprint sensor module 30 presses the switch 28 by causing a flipping motion of the arm part 68 across the virtual center line 80. In FIG. 4, the arm part 68 drawn in solid lines represents the position before the flipping motion, while the arm part 68 drawn in two-dot chain lines (imaginary lines) represents the position after the flipping motion.

Also, as illustrated in FIG. 3, the above-described opening 22, switch 28, and fingerprint sensor module 30 are coaxially disposed. A central axis line 82 through the opening 22, switch 28, and fingerprint sensor module 30 is inclined relative to the thickness direction of the enclosure 12. More specifically, the central axis line 82 is inclined so as to be biased to the center side in the length direction of the enclosure 12 (to the side indicated by arrow C) as it goes from the upper surface of the enclosure 12 to its underside.

Next the operation and effects of the embodiment will be described.

As discussed in detail above, according to the embodiment, the water sealing member 32 has as its integral parts the wall part 66 for blocking entry of water from the opening 22 and the arm part 68 supporting the fingerprint sensor module 30. The wall part 66 tightly fits on the inner surface of the opening 22, and the arm part 68 extends from the wall part 66 to the inner side of the opening 22. Thus, the size of the enclosure 12 may be reduced compared to a design which positions a water sealing member for blocking entry of water from outside the opening 22, for example.

As an example of the design which positions the above-described water sealing member outside the opening 22, a slit may be formed around the opening 22 and a part of the water sealing member may be press-fit into the slit. Another design includes, for example, a rubber member for supporting a fingerprint sensor module, a holder member disposed around the rubber member, and an O-ring serving as a water sealing member provided on the periphery of the holder member. In contrast to these designs, the electronic device 10 according to the embodiment has the wall part 66 (the water sealing member) and the arm part 68 provided inside the opening 22, hence enabling reduction in the size of the enclosure 12.

The water sealing member 32, having the wall part 66, includes as its integral part the arm part 68 for supporting the fingerprint sensor module 30. Thus, the number of parts may be reduced compared with a case where a water sealing member for blocking entry of water and a supporting member for supporting the fingerprint sensor module 30 are separate pieces. This may reduce assembly steps as well as costs.

In the electronic device 10, water sealing is achieved at two positions: at the double-sided adhesive tape 76 between the arm part reinforcer 62 and the fingerprint sensor module 30, and at the wall part 66. Due to the low number of points of water sealing, waterproofness is more secure. Also, the double-sided adhesive tape 74 fixing the lower end of the wall part 66 and the bent portion 72 to the end 36A of the extending part 36 is positioned inside the water sealing member 32 in the enclosure 12. The double-sided adhesive tape 74 accordingly does not have to serve as a water sealing barrier and the adhesion area of the double-sided adhesive tape 74 thus may be small. This enables further reduction in the size of the enclosure 12.

The central axis line 82 through the opening 22, switch 28, and fingerprint sensor module 30 is inclined relative to the thickness direction of the enclosure 12. Thus, the projection area of the opening 22, switch 28, and fingerprint sensor module 30 in the thickness direction of the enclosure 12 may be small, which also enables reduction in the size of the enclosure 12.

Additionally, the wall part 66 is reinforced by the wall part reinforcer 60. This helps the wall part 66 tightly fit on the inner surface of the opening 22 with increased stability. Moreover, the bent portion 72 is formed in a lower end of the reinforcer body 70 buried in the wall part 66. This may improve the rigidity of the wall part reinforcer 60 and hence that of the wall part 66, thereby further improving the water sealing ability of the wall part 66.

The extending part 36 extends from the supporting part 34 to the opening 22 side (that is, the upper surface side of the enclosure 12), and the lower end of the wall part 66 and the bent portion 72 formed in the wall part reinforcer 60 are fixed to the end 36A of the extending part 36. Accordingly, when the fingerprint sensor module 30 is pressed to the back surface side of the enclosure 12, the resulting load may be received by the end 36A of the extending part 36. This may keep the fingerprint sensor module 30 and the water sealing member 32 from dropping to the back surface side of the enclosure 12. The bent portion 72 is secured between the opening edge 22C of the opening 22 on the side of the extending part 36 and the end 36A of the extending part 36. This avoids the slipping of the fingerprint sensor module 30 and the water sealing member 32 to the upper surface side of the enclosure 12 as well.

Also, as illustrated in FIG. 4, when the fingerprint sensor module 30 is pressed, the arm part 68 flips across the virtual center line 80 which is orthogonal to the opening direction of the opening 22 and passing through the connecting portion between the arm part 68 and the wall part 66. The arm part 68 is connected to a middle portion of the wall part 66 in its height direction (more specifically, at a position higher than the lower end of the wall part 66 and lower than the center of the wall part 66 when seen in its height direction). Thus, the inclination angle of the arm part 68 relative to the direction orthogonal to the opening direction of the opening 22 may be made small, which in turn makes the amount of contraction of the arm part 68 during its flipping motion small. This may decrease the load desired for pressing the fingerprint sensor module 30 and thereby improve the operability of the fingerprint sensor module 30 when it is pressed.

Next, variations of the embodiment will be described.

While the fingerprint sensor module 30 is used as an example of a key top member in the embodiment, a component other than the fingerprint sensor module 30 may be used as the key top member.

While the opening 22 is described as being formed on one edge 18A of the front case 18 seen in the length direction, it may be formed in other positions on the enclosure 12.

While the switch 28 is described as a so-called dome switch, it may be other kinds of switch.

The arm part 68 is described as being connected to a part on the lower end side of the center of the wall part 66 in its height direction as an example of the middle portion of the wall part 66 in the height direction. Alternatively, the arm part 68 may be connected to the center of the wall part 66 in its height direction or to a point on the upper end side of the center of the wall part 66 in its height direction.

While the wall part reinforcer 60 and arm part reinforcer 62 are described as being made of sheet metal, they may be made of other materials.

While the electronic device 10 is described as having the display 14, it does not necessarily have the display 14.

Note that the variations above may be practiced in combination as appropriate.

While an embodiment of the technique according to the present disclosure has been described, it will be appreciated that the above description is not limitative and the technique according to the present disclosure may be practiced with various modifications made thereto without departing from its scope.

In relation to an aspect of the technique according to the present disclosure described above, the following appendices are further disclosed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that various changes, substitutions, and alterations could be made hereto without departing from the spirit and scope of the invention.

What is claimed is:

1. An electronic device comprising:
   an enclosure that has an opening formed therein;
   a switch disposed in the enclosure opposite the opening;
   a key top member disposed inside the opening;
   a water sealing member that has a wall part which extends such that a height direction of the wall part coincides with an opening direction of the opening and which seals an inner surface of the opening, an arm part which extends from the wall part to the inner side of the opening and supports the key top member, and a wall part reinforcer provided in the wall part; and
   a holder member that has a supporting part to support the switch, and an extending part which extends from the supporting part to an opening side of the enclosure, wherein
   a lower end of the wall part is fixed to an end of the extending part,
   the wall part reinforcer has a reinforcer body which extends such that the height direction of the reinforcer body coincides with the height direction of the wall part, and a bent portion formed by bending the reinforcer body at a lower end thereof toward an outer side of the opening, and
   the bent portion is secured between an opening edge of the opening on the side of the extending part and the end of the extending part.

2. The electronic device according to claim 1, wherein
   the arm part is positioned between the key top member and the switch, and extends from a height-direction middle portion of the wall part to the inner side of the opening and to the side of the key top member, and
   the key top member presses the switch by causing a flipping motion of the arm part across a virtual center line that is orthogonal to the opening direction of the opening and passes through a connecting portion between the arm part and the wall part.

3. The electronic device according to claim 2, wherein the key top member is a fingerprint sensor module.

4. The electronic device according to claim 1, wherein a central axis line through the opening, the switch, and the key top member is inclined relative to a thickness direction of the enclosure.

5. The electronic device according to claim 4, wherein the key top member is a fingerprint sensor module.

6. The electronic device according to claim 1, wherein the key top member is a fingerprint sensor module.

7. An electronic device comprising:
an enclosure that has an opening formed therein;
a switch disposed in the enclosure opposite the opening;
a key top member disposed inside the opening; and
a water sealing member that has a wall part which extends such that a height direction of the wall part coincides with an opening direction of the opening and which seals an inner surface of the opening, an arm part which extends from the wall part to the inner side of the opening and supports the key top member, and a wall part reinforcer provided in the wall part, wherein
the water sealing member is a separate piece from the wall part reinforcer and has an arm part reinforcer provided at an end of the arm part, and
the arm part reinforcer is fixed to the key top member.

8. The electronic device according to claim 7, wherein the arm part reinforcer is fixed to the key top member with double-sided adhesive tape.

9. The electronic device according to claim 8, wherein the key top member is a fingerprint sensor module.

10. The electronic device according to claim 7, wherein the key top member is a fingerprint sensor module.

* * * * *